United States Patent [19]

Jeong

[11] Patent Number: 5,574,756
[45] Date of Patent: Nov. 12, 1996

[54] METHOD FOR GENERATING DIGITAL COMMUNICATION SYSTEM CLOCK SIGNALS & CIRCUITRY FOR PERFORMING THAT METHOD

[75] Inventor: Deog-Kyoon Jeong, Seoul, Rep. of Korea

[73] Assignee: Samsung Electronics Co., Ltd., Suwon, Rep. of Korea

[21] Appl. No.: 332,561

[22] Filed: Oct. 31, 1994

[30] Foreign Application Priority Data

May 25, 1994 [KR] Rep. of Korea ................ 1994-11407

[51] Int. Cl.⁶ .................................................. H03D 3/24
[52] U.S. Cl. .................... 375/376; 375/375; 327/147; 327/149; 327/156; 331/14; 331/25
[58] Field of Search .................................... 375/376, 371, 375/373, 375, 344, 327; 327/147, 156, 159; 331/25, 34; 455/255, 258, 259, 260; 329/307, 308, 309, 310, 325

[56] References Cited

U.S. PATENT DOCUMENTS

| | | | |
|---|---|---|---|
| 4,494,021 | 1/1985 | Bell et al. | 307/591 |
| 4,584,695 | 4/1986 | Wong et al. | 375/327 |
| 4,821,297 | 4/1989 | Bergmann et al. | 375/376 |
| 5,132,633 | 7/1992 | Wong et al. | 328/14 |
| 5,185,768 | 2/1993 | Ferraiolo et al. | 375/373 |
| 5,239,561 | 8/1993 | Wong et al. | 375/327 |
| 5,245,637 | 9/1993 | Gersbach et al. | 375/374 |

*Primary Examiner*—Wellington Chin
*Assistant Examiner*—Huong Luu
*Attorney, Agent, or Firm*—Allen LeRoy Limberg

[57] ABSTRACT

A clock generating circuit generates 2n clocks (where n is a positive integer number) each having $1/2n$ frequency of a maximum baud rate of data bit-stream input and a phase difference of $\pi/n$ between successive phases thereof, and simultaneously shifts the phases on the clocks ahead or behind until the phases between the clocks and corresponding data bits of the data bit-stream input are locked in quadrature, by comparing the phase of the clock with those of data bit-stream input and adjusting the phases of the clocks.

31 Claims, 8 Drawing Sheets

METHOD FOR GENERATING DIGITAL COMMUNICATION SYSTEM CLOCK SIGNALS & CIRCUITRY FOR PERFORMING THAT METHOD

FIELD OF THE INVENTION

The invention relates to digital communication systems and, more particularly, to a method for generating a clock phase-synchronized with data received at high baud rate and circuitry for performing that method.

BACKGROUND OF THE INVENTION

Generally, in a data receiving device for a digital communication system, a synchronous clock for receiving data is recovered by using the extracted synchronous clock. To this end, a conventional clock recovery circuit generally uses a phase lock loop (hereinafter referred to as PLL).

Figure 1:
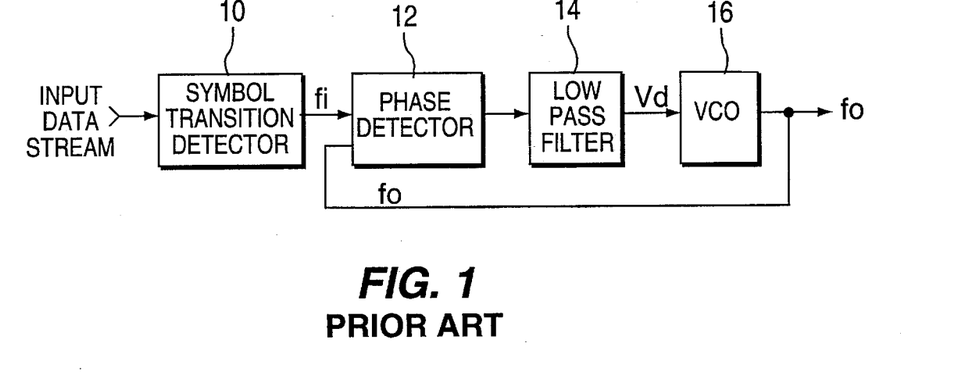
FIG. 1 is a block diagram of a conventional clock recovery circuit.

Referring to FIG. 1, a conventional clock recovery circuit comprises a symbol transition detector 10 for detecting symbol transitions in the data stream input and supplying an input clock fi switching between logic "0" and logic "1" levels responsive to each symbol transition, a phase detector 12 for developing an error signal by comparing a phase of the input clock fi with a phase of an output clock fo fed back to the phase detector 12, a low pass filter 14 for eliminating a high-frequency component from that error signal and to supply a direct voltage component $V_d$ of that error signal, and a voltage-controlled oscillator (or VCO) 16 for adjusting the frequency of the output clock fo in accordance with $V_d$. The phase detector 12, the low pass filter 14 and the VCO 16 form the PLL that locks the frequency of the output clock fo output from the VCO 16 in quadrature phasing with the input clock fi, so the nominal phase between the input clock fi and the output clock fo is 90°. Accordingly, sampling of each input data bit can be executed on a rising edge of the output clock fo, so as to sample the bit at the time most likely to result in accurate data recovery.

The PLL in the FIG. 1 clock recovery circuit operates as an automatic frequency and phase control (AFPC) loop for controlling both the frequency and the phase of the VCO 16. Variants of the FIG. 1 clock recovery circuit are known to be possible in which the frequency and phase control functions are advantageously kept separate, with the PLL just controlling the phase of the clock signal supplied to the data sampler and to the phase detector 12. In such a variant, the frequency of the VCO 16 is controlled independently of phase using control signal supplied by a very long-time constant automatic frequency control (AFC) loop, rather than using $V_d$ as its control signal; and the VCO is followed by a phase controller that responds to the VCO output signal to supply clock signal to the data sampler and to the phase detector 12 in a phase determined by the $V_d$ response of the PLL lowpass filter 14.

Conventional clock recovery circuits based upon the PLL structure, as exemplified by the FIG. 1 clock recovery circuit or the described variant thereof, function satisfactorily in maintaining quadrature phasing between the input clock fi and the output clock fo when the clock is recovered from a data bit stream received at a relatively low speed. But such a clock recovery circuit does not maintain such quadrature phasing satisfactorily when the clock has to be recovered from input data having high data bit transmission speeds (e.g., of a gigahertz or more), so the accuracy of data recovery is compromised.

As the data rate goes up and the frequency of the input clock fi and the output clock fo is correspondingly increased, the period of these clocks being inversely related to their frequency is reduced, so small amounts of time delay represent a larger amounts of phase shift in terms of radians or degrees. The PLL is a feedback loop that can be analyzed as a tracking filter, by referring the performances of its constituent parts to baseband. The stability of a feedback loop is determined by phase margin, the number of radians or degrees of additional open-loop phase shift as referred to baseband that are required to make the feedback loop regenerative, rather than degenerative, in operation. As the frequency of the output clock fo is increased to accommodate higher data bit transmission speeds, the incidental delay the fedback output clock fo encounters in the phase detector 12 decreases the open-loop phase margin by proportionately larger amounts, which eventually leads to the loss of tracking capability.

Other clock recovery schemes which rely on phase lock loops are known in the prior art, which use different phase detectors to determine when data is not optimally sampled. The problem of the loss of tracking capability as baud rate goes up and symbol periods shorten is also noted in these other types of PLL.

SUMMARY OF THE INVENTION

An important aspect of the invention is modifying conventional phase-lock loop (PLL) operating methods so as to as to assign consecutive transitions of the fo output clock cyclically to first through $m^{th}$ sets of fo output clock transitions, m being an integer greater than one, and then to control the delay of each of said first through $m^{th}$ sets of similarly in response to a control signal, for generating delayed fo output clock transitions for comparison with input signal transitions. As far as phase detection is concerned, this is a subsampling procedure that reduces the effective frequency of the output clock fo by a factor of m times, as compared to controlling the phasing of fo output clock transitions individually per conventional practice. This reduction of the effective frequency of the output clock fo by a factor of m times also reduces by that factor of m times the effective phase shift attributable to the incidental delay the fedback fo output clock encounters in the phase detector, so the reduction of phase margin by that delay is less severe. Accordingly, at least under ideal circumstances, the frequency of the input clock fi associated with input signal can be made that factor of m times higher, before phase margin is reduced to such degree that the tracking capability of the PLL is no longer satisfactory.

In accordance with a further aspect of the invention concerning phase-lock loop (PLL) operating methods, a multiple-phase clock comprising a plurality of component clocks of frequency (1/m) times fo is generated to provide the first through $m^{th}$ sets of fo output clock transitions, with $2\pi/m$ radians phase differences between them, for phase comparison with the fi input clock derived from transitions in the data bit-stream. A PLL error signal is generated by determining the departure of component clock transitions with fixed phasing between them, from their optimal phasing at midpoints of said symbol periods. This PLL error signal is lowpass filtered to develop a control signal that controls the phase of the multiple-phase clock within the PLL.

In a clock recovery circuit embodying the invention in another of its aspects, a multiple-phase clock comprised of a plurality m in number of component clocks of the same low frequency and offset in phase from each other by fixed intervals of 2π/m radians is generated by a clock generator and is supplied to a phase controller. The phase controller supplies a phase-shifted response to the multiple-phase clock, which phase-shifted response is used for sampling data bits at a frequency m times that same low frequency, using the rising edges of the component clocks. The phase controller included in a phase-lock loop (PLL). The PLL further includes a phase detector in which the component clocks of the phase-shifted response to the multiple-phase clock are compared in phase to the data clocking and the comparison results are averaged, for generating an error signal. The error signal is lowpass filtered to derive the control signal used for controlling the phase of the phase-shifted response to the multiple-phase clock supplied from the phase controller.

In another clock recovery circuit embodying the invention in another of its aspects, a multiple-phase clock comprised of a plurality m in number of component clocks of the same low frequency is generated by phase shifting one of its component clocks, as supplied from a controlled oscillator by (m−1) successive 2π/m radian amounts. The multiple-phase clock is supplied to a phase detector in which the component clocks of the multiple-phase clock are compared in phase to the data clocking and the comparison results are averaged, for generating an error signal. The error signal is lowpass filtered to derive a control signal applied to the controlled oscillator for controlling the frequency and phase of the its oscillations, thus completeing an automatic frequency and phase control (AFPC) loop that functions as a phase-lock loop for the multiple-phase clock, transitions of which multiple-phase clock are used to time the sampling of the data.

A still further aspect of the invention is embodied in a novel phase detector for comparing a multiple-phase output clock having an even number m=2n of phases with an input clock, n being an integer greater than one.

BRIEF DESCRIPTION OF THE DRAWING

In the drawing, it should be noted that like symbols or reference numerals in different figures represent like elements.

DETAILED DESCRIPTION OF THE PREFERRED EMBODIMENT

Figure 2:
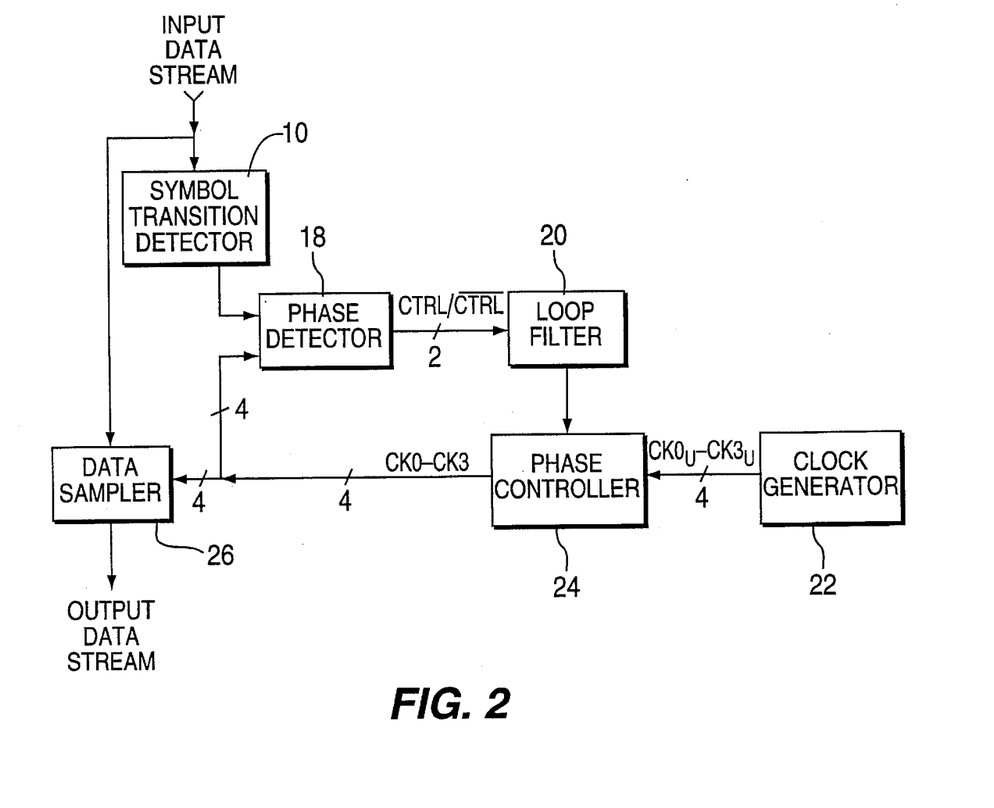
FIG. 2 is a block diagram of a clock generating circuit embodying the invention.

Referring to FIG. 2, a clock generating circuit embodying the invention includes, in addition to the symbol transition detector 10, a phase detector 18 for detecting the phase of data bit-stream input using a multiple-phase output clock comprising four component clocks CK0–CK3 and supplying phase detection signals CTRL and $\overline{\text{CTRL}}$; a loop filter 20 for receiving the phase detection signals CTRL and $\overline{\text{CTRL}}$ supplied from the phase detector 18 and supplying a phase control signal $V_{CTL}$ in which error signal a high-frequency component thereof is suppressed by lowpass filtering; a clock generator 22 for generating the four component clocks CK0–CK3 of a multiple-phase output clock, which component clocks have the same frequency and have phase differences of π/2 between successive ones of them; and a phase controller 24 for shifting the respective phases of the clocks ahead or behind in response to the phase control signal $V_{CTL}$. The symbol transition detector 10 supplies DATA and $\overline{\text{DATA}}$ input clocks that alternate having logic "0" and logic "1" states, transitions between those states being made responsive to transitions in the data bit-stream input. The clocks CK0–CK3, the phases of which are controlled by the phase controller 24, are supplied to the phase detector 18 and are also supplied to a data receiving circuit as a synchronizing clock for the purpose of executing a data sampling of the data bit-stream input. The phase detector 18 and loop filter 20 combine to provide a detector that detects any misphasing of said m component clocks from midpoints of said symbol periods to generate an error signal.

In FIG. 2, the clock generator 22 for generating the clocks CK0–CK3 and the phase controller 24 for controlling the phase of the clocks CK0–CK3 in response to the phase control signal $V_{CTL}$ have individual configurations as known in the art. The phase controller 24 comprises four controlled phase shifters, a respective one for each of the clocks CK0–CK3, each controlled in response to the phase control signal $V_{CTL}$. The phase detector 18 is of a type in which the phases of a multiple-phase clock are compared to the phases of respective transitions in the data bit stream. The phase detector 18 can be one in which for at least one phase of the output clock a respective stream of input clock pulses changing between "0" and "1" levels is selectively inverted responsive to that phase of the output clock being in a prescribed one of its "low" and "high" states to generate a stream of ternary pulses having "−1". "0" and "+1" levels, which stream of binary pulses is lowpass filtered to extract a control signal therefrom. Where the phase detector detects more than one phase of the output clock, the phase detection results are constructively combined to obtain the control signal.

Figure 3:
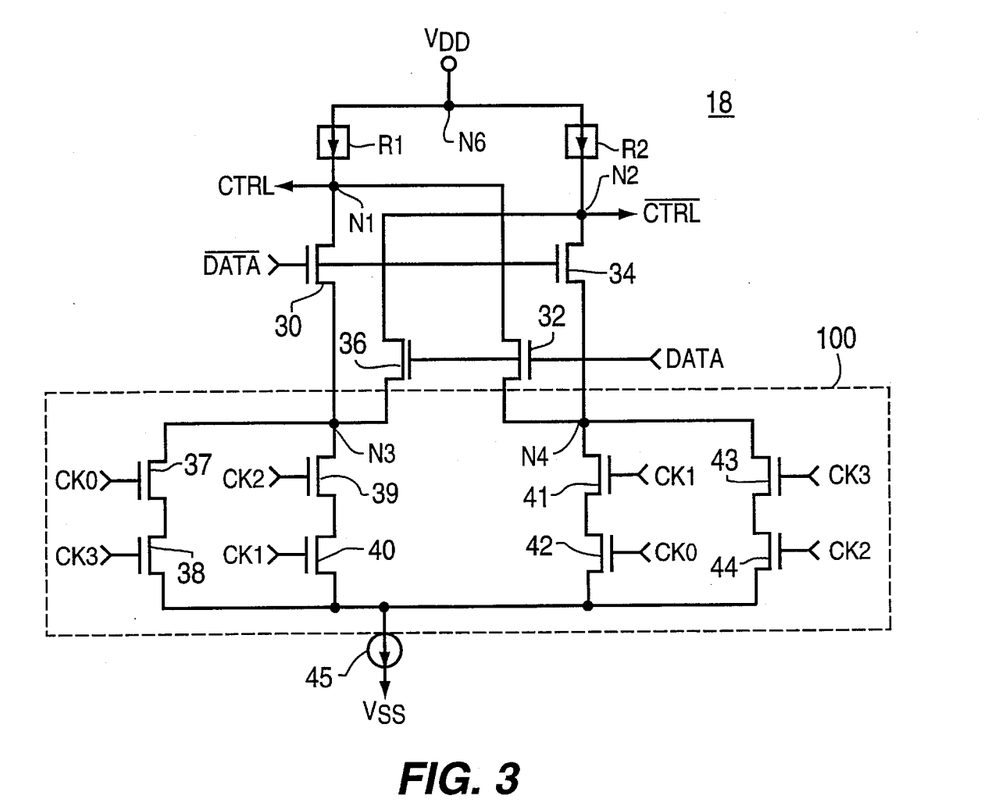
FIG. 3 is a circuit diagram showing a phase detector of the FIG. 2 clock generating circuit.

FIG. 3 shows a representative construction for a phase detector 18 of this general type, which particular phase detector 18 is of a more specific type suited for multiple-phase output clocks having an even number m=2n of phases, n being an integer greater than one. This more specific type of phase detector exploits the fact that (2π/m)=(π/n) radians phase differences between successive phases of the output clock corresponds to half a cycle of input clock. Referring to FIG. 3, an output node N1 supplying the signal CTRL is connected via a load R1 to a node N6, and an output node N2 supplying the signal $\overline{\text{CTRL}}$ is connected via a load R2 to the node N6, which is connected to receive a relatively positive operating voltage $V_{DD}$ as referred to a relatively negative operating voltage $V_{SS}$. The loads R1 and R2 are pull-up elements, such as resistors, for supplying respective electric currents to the corresponding nodes N1 and N2. The channels of n-channel field-effect transistors 30 and 32 selectively connect the output node N1 respectively to a first discharge node N3 and to a second discharge node N4. The channels of n-channel field-effect transistors 36 and 34 selectively connect the output node N2 to the first discharge node N3 and to the second discharge node N4. The inverted data-bit transition detector 10 response $\overline{DATA}$ is applied to the gates of the FETs 30 and 34, and the data-bit transition detector 10 response DATA is applied to the gates of the FETs 32 and 36.

Each of the n-channel FETs 30, 32, 34 and 36 turns on when a logic "1" (that is, a "high" level) is applied to the gate thereof, and turns off when a logic "0" (that is, a "low" level) is applied to the gate thereof. When the FET 30 is turned on, conduction through its channel selectively clamps nodes N1 and N3 together so potentials at the nodes N1 and N3 are substantially the same. When the FET 32 is turned on, conduction through its channel selectively clamps nodes N1 and N4 together so potentials at the nodes N1 and N4 are substantially the same. When the FET 34 is turned on, conduction through its channel selectively clamps nodes N2 and N4 together so potentials at the nodes N2 and N4 are substantially the same. When the FET 36 is turned on, conduction through its channel selectively clamps nodes N2 and N3 together so potentials at the nodes N2 and N3 are substantially the same.

The first and second discharge nodes N3 and N4 are connected to a discharge controller 100 including first, second, third and fourth selectively completed discharge paths so that the first and second discharge nodes N3 and N4 are alternately connected to a node N5 in response to the logic levels of the component clocks CK0–CK3 in a multiple-phase clock. A constant-current generator 45 is connected as a pull-down element for draining current from the node N5 referred to the relatively negative operating voltage $V_{SS}$, which causes substantially constant current to flow from the node N6 to the node N5 through the circuitry shown in FIG. 3 and to flow from the node N5 back to the node N6 through the operating voltage supply, completing the circuit for circulating this current which discharges the one of the nodes N3 and N4 selectively connected to the node N5 and thence to the constant-current generator 45. The first discharge node N3 in connected to the node N5 via the first selectively completed discharge path through the channels of n-channel field-effect transistors 37 and 38, the gates of which respectively receive the clocks CK0 and CK3, and via the second selectively completed discharge path through the channels of n-channel field-effect transistors 39 and 40, the gates of which respectively receive the clocks CK2 and CK1. The second discharge node N4 is connected to the node N5 via the third selectively completed path through the channels of n-channel field-effect transistors 41 and 42, the gates of which respectively receive the clock CK1 and CK0, and via the fourth selectively completed discharge path through the channels of n-channel field-effect transistors 43 and 44, the gates of which respectively receive the clocks CK3 and CK2. The constant-current generator 45 is always activated when a power supply is provided, returning current to the $V_{SS}$ supply voltage terminal which current is withdrawn from the node N5 at the ends of the first, second, third and fourth selectively completed discharge paths. That is, the current source 45 completes a constant-current drain connection from one of the discharge nodes N3 and N4, as selected by the first, second, third or fourth selectively completed discharge path.

The phase detector 18 is designed to lock the rising edges of the clocks CK0–CK3, collectively considered, in quadrature with the rising edges of the corresponding data bit-stream input. This is so optimum sampling of the input data is done in response to the rising edges of the clocks CK0–CK3.

Figure 4:
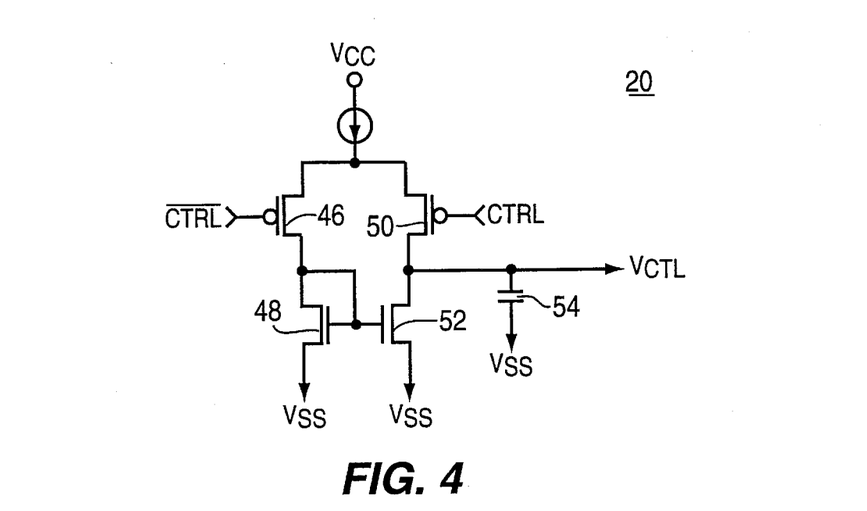
FIG. 4 is a circuit diagram showing a loop filter of the FIG. 2 clock generating circuit.

FIG. 4 is a circuit diagram showing the loop filter 20 of the FIG. 2 clock generating circuit, which FIG. 4 loop filter is suitable for use with the FIG. 3 phase detector 18, output nodes N1 and N2 of which phase detector 18 supply error signal in push/pull for application to the loop filter 20. The FIG. 4 loop filter 20 includes p-channel field-effect transistors 50 and 46 in source-coupled differential amplifier connection for receiving at their respective gate electrodes the detector output signals CTRL and $\overline{CTRL}$ that phase detector 18 supplies as push/pull error signal. An interconnection between the source electrodes of FETs 46 and 50 is supplied direct current from a power supply voltage $V_{CC}$ via a constant current source 55. The common mode rejection of the source-coupled differential amplifier formed by elements 46, 50 and 55 suppresses the common-mode potential in the push/pull or balanced error signal components CTRL and $\overline{CTRL}$.

The channel of an n-channel field-effect transistor 48 connects the drain of p-channel FET 46 to the ground voltage supply $V_{SS}$. The drain electrode of FET 48 is connected to its gate electrode in a self-biasing feedback connection that adjusts its source-to-gate potential to condition its channel to conduct the drain current of FET 46. The channel of an n-channel field-effect transistor 52 connects the drain of p-channel FET 50 to the ground voltage supply $V_{SS}$. The gate electrode of FET 52 is connected to the gate electrode of the FET 48, which connection applies the same source-to-gate potential to the FET 52 as is applied to the FET 48, conditioning the FET 52 to conduct channel current similar to that conducted by the FET 48. A capacitor 54 has a first plate connected to the ground voltage supply $V_{SS}$ and has a second plate connected to an interconnection between the drains of the n-channel FET 50 and the p-channel FET 52. The charging voltage of the capacitor 54 is supplied to the phase controller 24 as the phase control signal $V_{CTL}$ for degenerating the phase difference.

The constant current source 55 and the p-channel FETs 46 and 50 form a source-coupled differential amplifier, and the n-channel FETs 48 and 52 form a current mirror that converts the balanced drain currents from that differential amplifier to single-ended form, to supply current to charge the capacitor 54 or to withdraw current to discharge the capacitor 54, thereby changing the voltage across the capacitor 54 in proportion to the voltage difference between the signals CTRL and $\overline{CTRL}$. The constant-current-generator type of signal source the drains of the p-channel FET 50 and the n-channel FET 52 present to each other and to the capacitor 54 causes the source-coupled differential amplifier composed of elements 46, 50 and 55 to operate as a differential transconductance amplifier, rather than a differential voltage amplifier, as far as charging and discharging the capacitor 54 is concerned.

FIG. 5 is a waveform diagram depicting the operation of the FIG. 3 phase detector. FIG. 5A comprises four waveform diagrams depicting the component clocks CK0–CK3 of a multiple-phase output clock, each of which component clocks is phase shifted $\pi/2$ with respect to a respective preceding one of those component clocks. Various phases of the data bit-stream or input clock DATA are depicted in the uppermost waveform of each of the FIGS. 5B, 5C, 5D and 5E. The input data defines the data bit-stream clock or input clock DATA changing logic level from "1" to "0" (or from "0" to "1") with a constant period, and the maximum baud rate of the data bit-stream is four times higher that the frequency of the component clocks CK0–CK3 of a multiple-phase clock that are depicted in FIG. 5A. The input clocks DATA and $\overline{\text{DATA}}$ are each considered as positive logic signals with logic "0" being at a relatively low voltage and logic "1" being at a relatively high voltage.

During the detection of phase difference, as the clock generator 22 outputs the component clocks CK0–CK3 each having the same frequency and phase differences of $\pi/2$ between successive phases thereof, the phase detector 18 selectively completes the first discharge path, the third discharge path, the second discharge path, and the fourth discharge path in that order, cyclically. Accordingly, the discharge nodes N3 and N4 alternately perform a discharge operation during a quarter period of the multiple-phase clock. As a result, the logic levels of output nodes N1 and N2 are determined in accordance with the logic level of the input clocks DATA and $\overline{\text{DATA}}$.

Figure 5A:
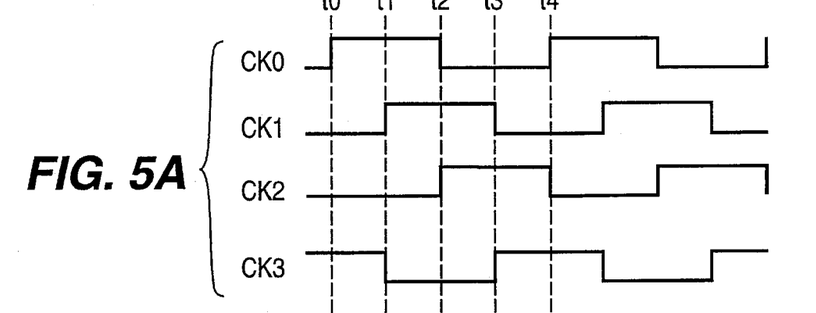
FIGS. 5A, 5B, 5C, 5D and 5E are waveform diagrams illustrating various operations of the FIG. 3 phase detector, which waveforms are plotted against a common time base and together comprise FIG. 5.
Figure 5B:
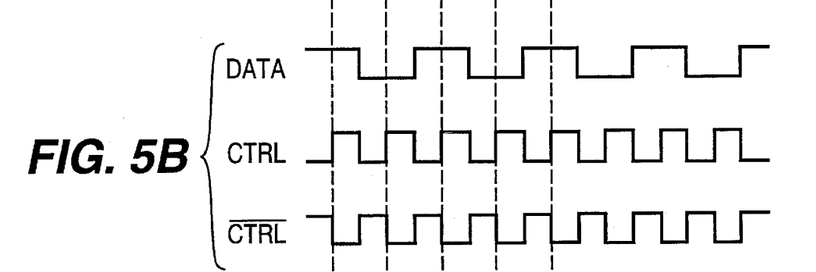

When the phases between the data bit-stream input and the component clocks CK0–CK3 are locked in quadrature, the operation of the phase detector 18 will be explained with reference to FIG. 5B.

For the period between the times $t_0$ and $t_1$, the first discharge path becomes conductive, in response to the clocks CK0 and CK3 being at high level. The second, third and fourth dicharge paths At the time $t_0$, as the DATA input clock is at logic "1" and the $\overline{\text{DATA}}$ complemented input clock is at logic "0", causing the n-channel FETs 32, 36 to turn on and the n-channel FETs 30, 34 to turn off. Therefore, the node N1 is connected to the node N4 via the n-channel FET 32, and the node N2 is connected to the node N3 via the n-channel FET 36. Because the third and the fourth discharge paths are not conductive, the node N4 is not connected to the ground terminal. So, owing to pull-up through the resistor R1, the node N1 supplies a "high" phase detection signal CTRL. But, since the node N3 is connected to the ground terminal via the first discharge path, the node N2 supplies a "low" phase detection signal $\overline{\text{CTRL}}$.

Since the phases of the input clocks DATA and $\overline{\text{DATA}}$ are locked in quadrature with the phases of the clocks CK0–CK3, the input clocks DATA and $\overline{\text{DATA}}$ switch voltage levels between time $t_0$ and $t_1$. After the switch in their voltage levels, the DATA input clock is at logic "0", causing the n-channel FETs 32, 36 to be turned off; and the $\overline{\text{DATA}}$ complemented input clock is at logic "1", causing the n-channel FETs 30, 34 to be turned on. As a result, the node N1 is connected to the node N3 via the n-channel FET 30, and the node N2 is connected to the node N4 via the n-channel FET 34. Since the node N3 is connected to the ground terminal via the first discharge path, the node N1 is pulled down and consequently supplies a "low" phase detection signal CTRL. The node N2 supplies "high" phase detection signal $\overline{\text{CTRL}}$ owing to pull-up through the resistor R2.

For the period between the times $t_1$ and $t_2$, the second discharge path becomes conductive only when the clocks CK0 and CK1 are at high level. At the time $t_1$, the input clock DATA is at logic "0" and the complemented input clock $\overline{\text{DATA}}$ is at logic "1", so that the n-channel FETs 32, 36 each continue to be turned off. As a result, the node N1 is connected to the node N3 via the n-channel FET 30, and the node N2 is connected to the node N4 via the n-channel FET 34. Since the first and the second discharge paths are not conductive, the node N3 is not connected to the ground terminal, so that the node N1 supplies the phase detection signal CTRL at "high" level owing to pull-up through the resistor R1. However, since the node N4 is connected to the ground terminal via the third discharge path, the node N2 supplies the phase detection signal $\overline{\text{CTRL}}$ at "low" level.

Since the phases between the data bit-steam input and the clocks CK0–CK3 are locked in quadrature, the input clocks DATA and $\overline{\text{DATA}}$ switch voltage levels between time $t_t$ and $t_2$. After this switch in voltage levels, the data bit of the DATA is at logic "1" and the data of the $\overline{\text{DATA}}$ is at logic "0", causing the n-channel FETs 32, 36 to turn on and the n-channel FETs 30, 34 to turn off. As a result, the node N1 is connected to the node N4 via the n-channel FET 32, and the node N2 is connected to the node N3 via the n-channel FET 36. Thereafter the node N1 supplies the phase detection signal CTRL at logic "low" level, and the node N2 supplies the phase detection signal $\overline{\text{CTRL}}$ at "high" level owing to pull-up through the resistor R2.

For the period between the times $t_2$ and $t_3$, the second discharge path becomes conductive only when the clock CK1 and CK2 are at high level. And, the operation of the phase detector 18 is the same as that for the period between the times $t_0$ and $t_1$. Also, for the period between the times $t_3$ and $t_4$, the fourth discharge path becomes conductive only when the clocks CK2 and CK3 are at logic "1". And the operation of the phase detector 18 is the same as that for the period between the times $t_1$ and $t_2$.

By the operation mentioned above, the phase detector 18 supplies the signals $\overline{\text{CTRL}}$ and CTRL alternately having "high" and "low" levels, at a frequency twice the maximum baud rate of the data bit-stream input. The signals $\overline{\text{CTRL}}$ and CTRL are applied as input signal to the loop filter 20 shown in FIG. 4.

In the loop filter 20, the capacitor 54 repeatedly executes the charging or discharging operation by the output signals CTRL and $\overline{\text{CTRL}}$ of the phase detector 18. That is, in the case where the signal CTRL applied to the gate of p-channel FET 50 is "high" and the signal $\overline{\text{CTRL}}$ applied to the gate of p-channel FET 46 is "low", as applied to the loop filter 20, since the voltage applied to the gate of p-channel FET 46 is lower than that applied to the gate of p-channel FET 50, the p-channel FET 46 turns on to hog the current supplied by the source 55 and the p-channel FET 50 is at least partially turned off. The drain current flow from the p-channel FET 46 is supplied as input current to the current mirror connection of n-channel FETs 48 and 52. As a result, the channel of n-channel FET 52 is conductive to to the ground voltage $V_{SS}$ terminal to demand current that is supplied by removing charge from the capacitor 54, which discharge operation reduces any voltage across the capacitor 54. On the other hand, in case where the signal CTRL applied to the gate of p-channel FET 50 is "low" and the signal $\overline{\text{CTRL}}$ applied to the gate of p-channel FET 46 is "high", the p-channel FET 50 is turned on to hog the current supplied by the source 55 and the p-channel FET 46 is turned off. As a result, the n-channel FET 52 turns off and the charging current is supplied to the capacitor 54 via the channel of n-channel FET 50.

In the cases where the input signals CTRL and $\overline{\text{CTRL}}$ alternate at high-frequency, the variation of an output voltage from the capacitor 54 in accordance with the charging and discharging operations is negligibly small and the phase control signal $V_{CTL}$ remains at an sustained level. Consequently, the phase controller 24 does not change the phases on clocks CK0–CK3 supplied from the clock generator 22. Therefore, the phases of clocks CK0–CK3 are locked and the logic level of each bit from the input data is extracted by the locked clocks CK0–CK3.

Figure 5C:
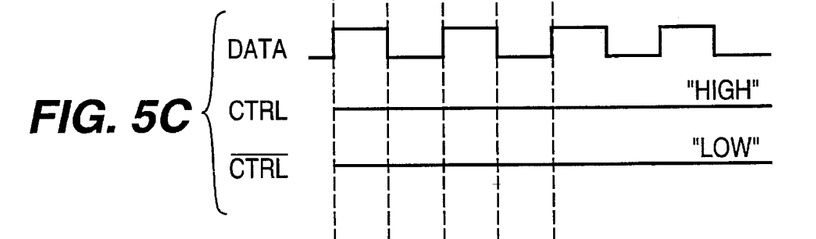

The case next to be considered is that in which the rising edge of clock is concurrent with the rising edge of the corresponding data bit, that is, the phases between the data bit-stream input and the clocks CK0–CK3 are not locked in quadrature, the operation of the phase detector 18 will be explained with reference to FIG. 5C.

For the period between the times $t_0$ and $t_1$, the first discharge path through the discharge controller 100 is conductive responsive to both the clocks CK0 and CK3 being "high". The second, third and fourth discharge paths through the discharge controller 100 are not completed between the times $t_0$ and $t_1$. The input clock DATA is at logic "1" causing the n-channel FETs 32, 36 to be turned on; and the complemented input clock $\overline{DATA}$ is at logic "0", causing the n-channel FETs 30, 34 to be turned off. Therefore, the node N1 is connected to the node N4 via the n-channel FET 32, and the node N2 is connected to the node N3 via the n-channel FET 36. The output node N1 continues to be pulled up by the resistor R1 and therefore continues to supply "high" phase detection signal CTRL. Since the node N4 is connected to the ground terminal via the third discharge path, the output node N2 supplies "low" phase detection signal $\overline{CTRL}$.

For the period between the times $t_1$ and $t_2$, the third discharge path through the discharge controller 100 is conductive responsive to both the clocks CK0 and CK1 being "high". The first, second and fourth discharge paths through the discharge controller 100 are not completed between the times $t_1$ and $t_2$. The input clock DATA is at logic "0", causing the n-channel FET 32, 36 to be turned off; and the complemented input clock $\overline{DATA}$ is at logic "1", causing the n-channel FETs 30, 34 to be turned on. Therefore, the node N1 is connected to the node N3 via the n-channel FET 30, and the node N4 is connected to the n-channel FET 34. As the node N3 is not connected to the ground terminal, the output node N1 continues to be pulled up by the resistor R1 so as to supply "high" phase detection signal CTRL. Since the node N4 is connected to the ground terminal via the third discharge path, the output node N2 continues to supply "low" phase detection signal $\overline{CTRL}$.

For the period between the times $t_2$ and $t_3$, the second discharge path through the discharge controller 100 is conductive responsive to both the clocks CK1 and CK2 being "high". The first, third and fourth discharge paths through the discharge controller 100 are not completed between the times $t_2$ and $t_3$. The input clock DATA is at logic "1", causing the n-channel FETs 32, 36 to be turned on; and the complemented input clock $\overline{DATA}$ is at logic "0", causing the n-channel FETs 30, 24 to be turned off. Therefore, just as in the period between the times $t_0$ and $t_1$, the node N3 is not connected to the ground terminal, so that the output node N1 continues to be pulled up by the resistor R1 so as to supply "high" phase detection signal CTRL. Since the node N4 is connected to the ground terminal via the second discharge path, the output node N2 continues to supply "low" phase detection signal $\overline{CTRL}$.

For the period between the times $t_3$ and $t_4$, the fourth discharge path through the discharge controller 100 is conductive responsive to the clocks CK2 and CK3 both being "high". The first, second and third discharge paths through the discharge controller 100 are not completed between the times $t_3$ and $t_4$. The input clock DATA is at logic "0", causing the n-channel FET 32, 36 to be turned off and the complemented input clock $\overline{DATA}$ is at logic "1", causing the n-channel FET 30, 34 to be turned on. Therefore, just as in the period between the times $t_0$ and $t_1$, the node N3 is not connected to the ground terminal, so that the output node N1 continues to be pulled up by the resistor R1 so as to supply "high" phase detection signal CTRL. Since the node N4 is connected to the ground terminal via the second discharge path, the output node N2 continues to supply "low" phase detection signal $\overline{CTRL}$.

With the operations mentions above, the phase detector 18 supplies a "high" CTRL signal and a "low" $\overline{CTRL}$ signal to the loop filter 20 shown in FIG. 4. The "high" CTRL signal applied to the gate electrode of p-channel FET 50 and the "low" $\overline{CTRL}$ signal applied to the gate electrode of p-channel FET 46 condition the p-channel FET 50 to be non-conductive and the p-channel FET 46 to be conductive. The conduction of current from the current source 55 through the channel of FET 46 to self-bias the n-channel FET 48 into conduction develops a voltage at the interconnected gate electrodes of the FETs 48 and 52 that turns on the n-channel FET 52. As a result, the capacitor 54 is discharged by conduction of charge through the channel of FET 52 to the ground terminal. The level of phase control signal voltage $V_{CTL}$ appearing across the capacitor 54 is continuously lowered in response to this discharging.

Consequently, in response to the lowering of $V_{CTL}$ the phase controller 24 performs a control operation so that the phases of clocks CK0–CK3 supplied from the clock generator 22 are further delayed. As result, the rising edges of clocks are controlled to concur with the middle point of the corresponding data bit. Upon the completion of the phase delay control of clocks, the phases of clocks CK0–CK3 are locked, and the logic of each bit from the input data is extracted by the locked clocks CK0–CK3 in the data receiving unit.

Figure 5D:
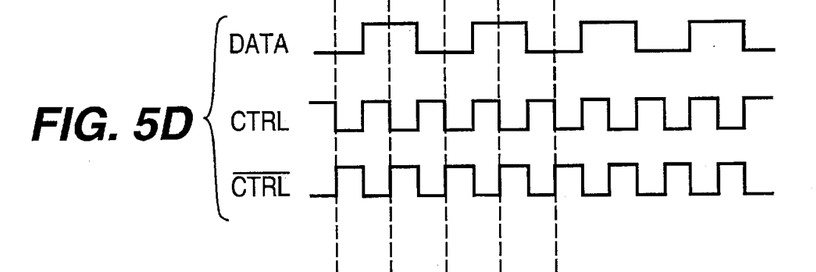

FIG. 5D is a waveform diagram showing the signals CTRL and $\overline{CTRL}$ output from the phase detector 18 when the rising edge of clock CK0 precedes the rising edge of corresponding data bit. The case when the rising edge of clock CK0 precedes the rising edge of corresponding data bit is similar to the case where the rising edge of clock CK0 occurs after the rising edge of corresponding data bit. In this case, the phase detector 18 supplies the signals CTRL and $\overline{CTRL}$ having the frequency corresponding to two times as high as a maximum baud rate of the data bit-stream input and alternating between logic levels. Accordingly, the phases between the data bit-stream input and the clocks CK0–CK3 are locked in quadrature. The phase locking operation of FIG. 5D will not be explained, since the foregoing disclosure makes the operation apparent to those skilled in the art to which the invention pertains.

Figure 5E:
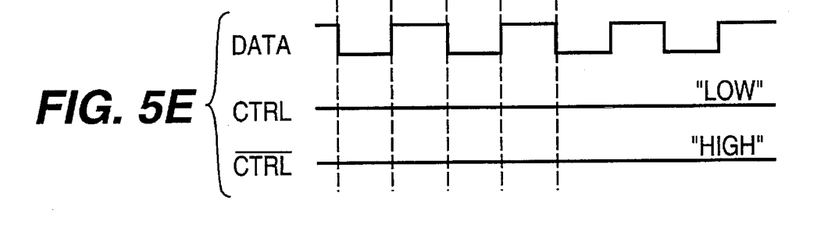

FIG. 5E is a waveform diagram showing the signals CTRL and $\overline{CTRL}$ supplied from the phase detector 18 when the rising edge of clock CK0 is concurrent with the falling edge of the input clock DATA. The case in which the rising edge of clock CK0 is concurrent with the falling edge of the input clock DATA is similar to the case in which the rising edge of clock CK0 is concurrent with the rising edge of the input clock DATA shown in FIG. 5C. However, the phase detector 18 supplies the loop filter 20 a "low" CTRL signal and a "high" $\overline{CTRL}$ signal when the rising edge of clock CK0 is concurrent with the falling edge of the input clock DATA. The "high" $\overline{CTRL}$ signal applied to the gate electrode of p-channel FET 46 and the "low" CTRL signal applied to the gate electrode of p-channel FET 50 condition the p-channel FET 46 to be non-conductive and the p-channel FET 50 to be conductive. As a result of the p-channel FET 46 being non-conductive, the n-channel FETs 48 and 52 are turned off, the turning off of FET 52 interrupting the path for discharging the capacitor 54. Charging current is supplied to the capacitor 54 from the current source 55 via the p-channel FET 50. The level of phase control signal voltage $V_{CTL}$ appearing across the capacitor 54 is continuously raised in response to this charging.

Consequently, the phase controller 24 performs the control operation so that the delay time of the clocks CK0–CK3 supplied from the clock generator 22 is reduced, so the rising edges of the clocks CK0–CK3 are advanced in time. As a result, the rising edges of the clocks CK0–CK3 are locked in quadrature with the input clock so as to ocur at the midpoint of the symbol period. Upon the completion of the phase delay control of clocks, the phases of clocks CK0–CK3 are locked, and each symbol of the input data is sampled at optimal time as timed by the rising edges of the locked clocks CK0–CK3.

When rather than using four component clocks in the multiple-phase output clock, 2n component clocks are used with a phase shift between consecutive phases equal to $\pi$ radians of the input clock, n being an integer greater than two as well as greater than one, the FIG. 3 phase detector is modified with regard to the discharge controller 100. The modification provides n selectively completed discharge paths from the node N3 and another n selectively completed discharge paths from the node N4, for a total of 2n selectively completed discharge paths through the modified discharge controller 100. Each of these selectively completed discharge paths can be provided by the series connection of two n-channel FETs controlled by appropriate ones of the component clocks applied to their respective gate electrodes. For a six-phase output clock composed of component clocks CK0–CK5, for example, the first selectively completed discharge path from the node N3 is through the channels of a pair of n-channel FETs receiving CK0 and CK4 at their respective gate electrodes; the second selectively completed discharge path from the node N3 is through the channels of a pair of n-channel FETs receiving CK2 and CK0 at their respective gate electrodes; the third selectively completed discharge path from the node N3 is through the channels of a pair of n-channel FETs receiving CK4 and CK2 at their respective gate electrodes; the fourth selectively completed discharge path from the node N4 is through the channels of a pair of n-channel FETs receiving CK1 and CK5 at their respective gate electrodes; the fifth selectively completed discharge path from the node N4 is through the channels of a pair of n-channel FETs receiving CK3 and CK0 at their respective gate electrodes; and the sixth selectively completed discharge path from the node N4 is through the channels of a pair of n-channel FETs receiving CK5 and CK3 at their respective gate electrodes. For an eight-phase output clock composed of component clocks CK0–CK7, by way of further example, the first selectively completed discharge path from the node N3 is through the channels of a pair of n-channel FETs receiving CK0 and CK5 at their respective gate electrodes; the second selectively completed discharge path from the node N3 is through the channels of a pair of n-channel FETs receiving CK2 and CK7 at their respective gate electrodes; the third selectively completed discharge path from the node N3 is through the channels of a pair of n-channel FETs receiving CK4 and CK1 at their respective gate electrodes; the fourth selectively completed discharge path from the node N4 is through the channels of a pair of n-channel FETs receiving CK6 and CK3 at their respective gate electrodes; the fifth selectively completed discharge path from the node N4 is through the channels of a pair of n-channel FETs receiving CK1 and CK6 at their respective gate electrodes; the sixth selectively completed discharge path from the node N4 is through the channels of a pair of n-channel FETs receiving CK3 and CK0 at their respective gate electrodes; the seventh selectively completed discharge path from the node N4 is through the channels of a pair of n-channel FETs receiving CK5 and CK2 at their respective gate electrodes. and the eighth selectively completed discharge path from the node N4 is through the channels of a pair of n-channel FETs receiving CK7 and CK4 at their respective gate electrodes. Other variants of the FIG. 3 circuit will be apparent to the skilled electronic circuit designer.

The biasing circuitry comprising loads R1 and R2 that tend to pull respective potentials at the nodes N1 and N2 in a first direction and further comprising the constant-current generator 45 to pull potential at the node N5 in a second direction opposite to said first direction can be redesigned in a number of ways, for example. In certain variants the constant-current generator 45 is replaced by direct wire connection or by a resistor. In another variant the resistors R1 and R2 are replaced by respective constant-current generators, and the constant-current generator 45 is replaced by a resistor. In other variants the constant-current generator 45 is relocated between node N5 and the relatively positive operating voltage $V_{DD}$, and the node N6 is connected to relatively negative operating voltage $V_{SS}$, either directly or through a resistor. The biasing circuitry FIG. 3 shows for its phase detector 18 simplifies direct coupling from the preceding circuitry and to the following loop filter 20.

The discharge controller 100 can be modified in accordance with switching theory to provide the first, second, third or fourth selectively completed discharge paths by equivalent means. For example, the serial connection of the channels of FETs 41 and 42 in the third selectively completed discharge path can be reversed in order, and the FETs 40 and 41 replaced by a single FET, using standard logic reduction technique. Then, the serial connection of the channels of FETs 43 and 44 in the fourth selectively completed discharge path can be reversed in order, and the FETs 38 and 43 replaced by a single FET, using standard logic reduction technique. As an alternative example, the serial connection of the channels of FETs 37 and 38 in the first selectively completed discharge path can be reversed in order, and the FETs 37 and 42 replaced by a single FET, using a standard logic reduction method. Then, the serial connection of the channels of FETs 39 and 40 in the second selectively completed discharge path can be reversed in order, and the FETs 39 and 42 replaced by a single FET, using standard logic reduction technique. The modified forms of the discharge controller 100 decribed for 2n>4 component clocks can be further modified in accordance with switching theory, using standard logic reduction techniques for example.

Figure 6:
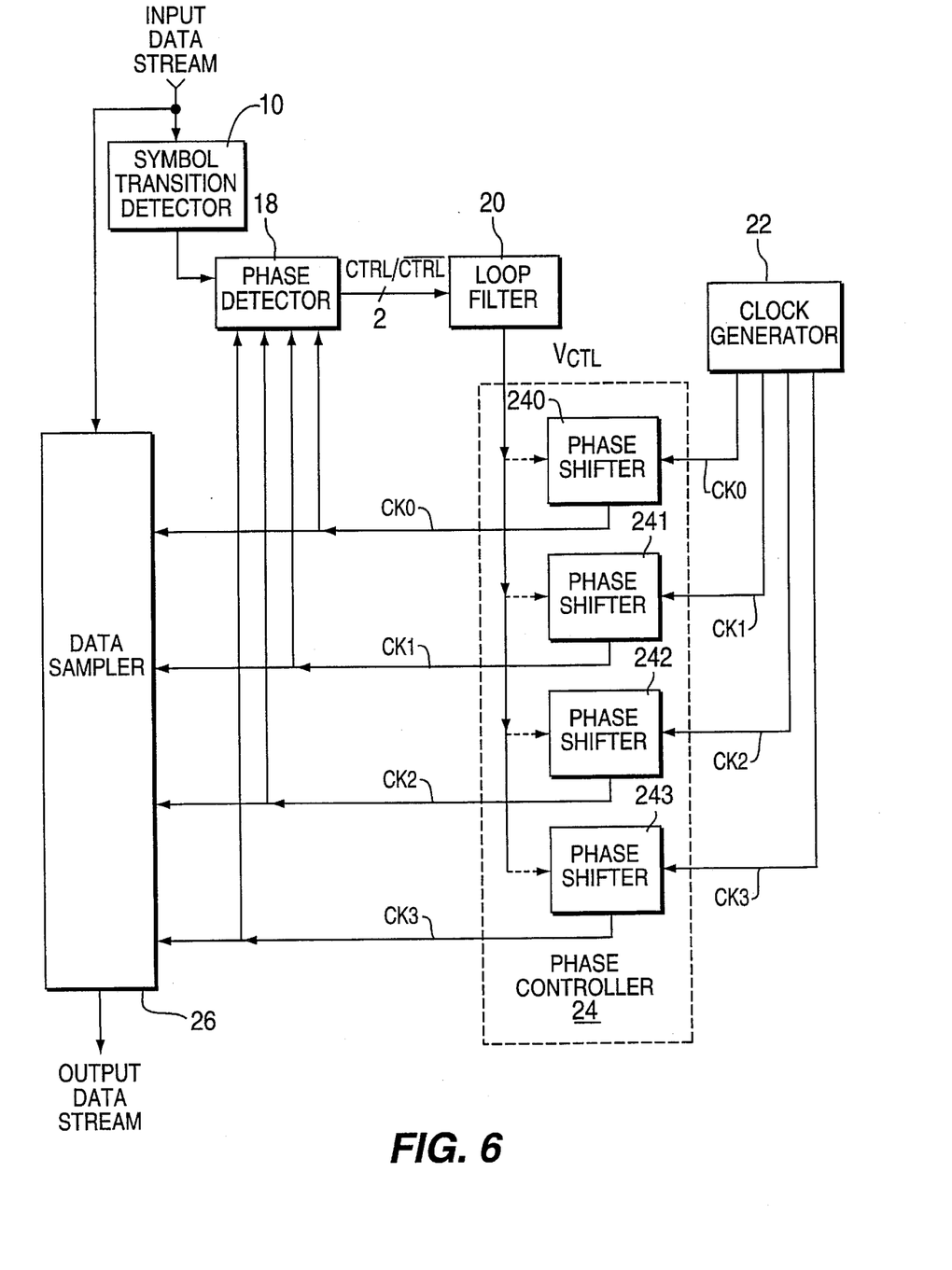
FIG. 6 is a block diagram showing in more detail how the phase controller in the FIG. 2 clock generating circuit can be constructed.

FIG. 6 shows in detail the phase controller 24 used in the FIG. 2 clock generating circuit for controlling the phase of the clocks CK0–CK3 in response to the phase control signal $V_{CTL}$. The phase controller 24 for controlling the phase of the clocks CK0–CK3 in response to the phase control signal $V_{CTL}$ has to be one in which the phase shifts between the successive transitions in the multiple-phase output clock they comprise cannot change independently of each other. The FIG. 6 phase controller 24 comprises a respective controlled phase shifter 241, 242, 243, 244 for each of the clocks CK0, CK1, CK2, CK3. The controlled phase shifters 241, 242, 243, 244 are alike in their respective constructions and are each controlled similarly by the phase control signal $V_{CTL}$. By way of example, each of the controlled phase shifters 241, 242, 243, 244 can comprise a cascade connection of resistor-capacitor (RC) sections, each of which RC sections consists of an input series capacitor working into an output shunt resistor provided by the channel of a field effect transistor, which FET is operated so its channel resistance is controlled by $V_{CTL}$. The time constant of the PLL generating $V_{CTL}$ is so long that the phase shifts between the successive phases supplied from the controlled phase shifters 241, 242, 243, 244 of the phase controller 24 change concurrently inasfar as their effect on phase margin in the PLL is concerned. Lowpass or bandreject filtering of $V_{CTL}$ to suppress any remnant output clock variation thereon will maintain the phase shifts between the successive phases supplied from the controlled phase shifters 241, 242, 243, 244 still more constant.

Figure 7:
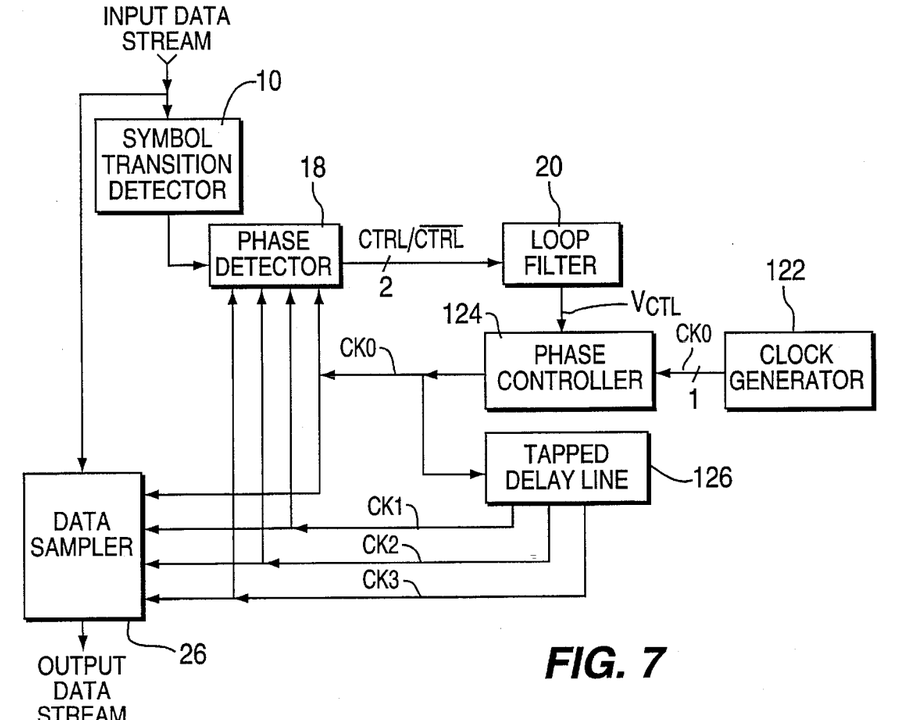
FIGS. 7, 8 and 9 are block diagrams of other clock generating circuits embodying the invention.

FIG. 7 shows a modification of the FIG. 2 clock generating circuitry in which the clock generator 22 that supplies unshifted clocks CK0–CK3 is replaced by a clock generator 26 that generates an unshifted clock CK0. Also, the four-phase phase controller 24 that supplies phase-shifted clocks CK0–CK3 to the phase detector 18 is replaced by a single-phase phase controller 28 and a tapped delay line 30. The single-phase phase controller 28 receives the unshifted clock CK0 from the clock generator 26 and supplies a phase-shifted clock CK0 to the phase detector 18 and to the tapped delay line 30.. The tapped delay line 30 supplies phase-shifted CK1, CK2 and CK3 clocks to the phase detector 18 as responses to the CK0 clock that are supplied after respective phase delays of $\pi/2$, $\pi$ and $3\pi/2$. The phase-shifting of the CK0, CK1, CK2 and CK3 clocks is the same, providing the subsampling of the output clock that the invention uses to maintain phase margin at higher clock frequencies. The phase-shifted clocks CK0–CK3 are controlled so as to have their rising edges in the midpoints of data symbol periods.

Figure 8:
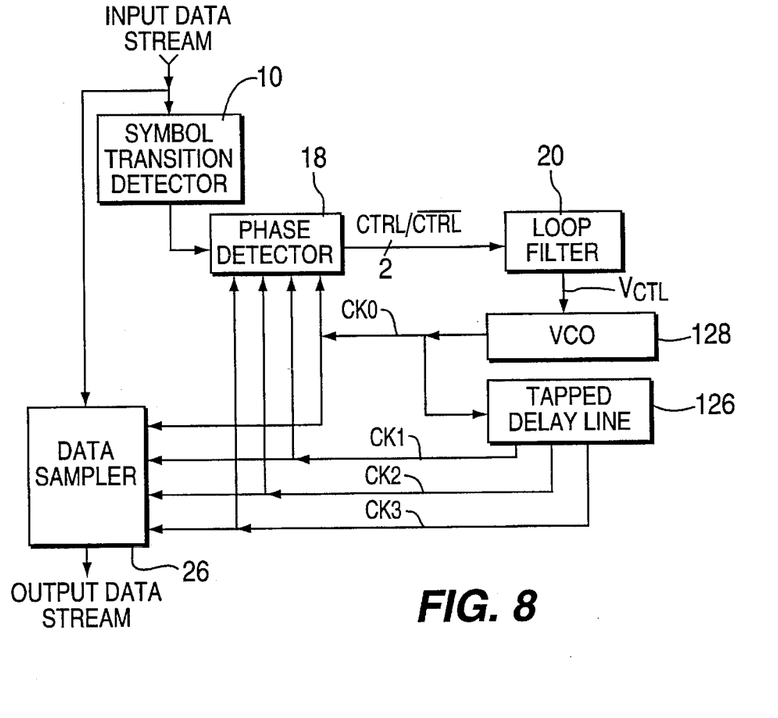

FIG. 8 shows a modification of the FIG. 2 clock generating circuitry in which the clock generator 22 that supplies the clocks CK0–CK3 each having the same frequency and the phase controller 24 that phase-shifts the clocks CK0–CK3 in accordance with the phase control signal $V_{CTL}$ are replaced by a voltage-controlled oscillator (VCO) 32 and a tapped delay line 34. The VCO 32 is automatically frequency and phase controlled (AFPC'd) by the control voltage $V_{CTL}$ supplied by the loop filter 20. The VCO 32 supplies CK0 component of output clock to the phase detector 18 and to the tapped delay line 34. The tapped delay line 34 supplies CK1, CK2 and CK3 clocks to the phase detector 18 as responses to the CK0 clock that are supplied after respective phase delays of $\pi/2$, $\pi$ and $3\pi/2$. The phase-shifted clocks CK0–CK3 are controlled so as to have their rising edges at the midpoints of data symbol periods. To avoid an undesirable resonance phenomenon in the loop, it is preferable that the capacitor 54 of the loop filter 20 be decoupled from the control input of the VCO 32 by additional lowpass or bandreject filtering.

Figure 9:
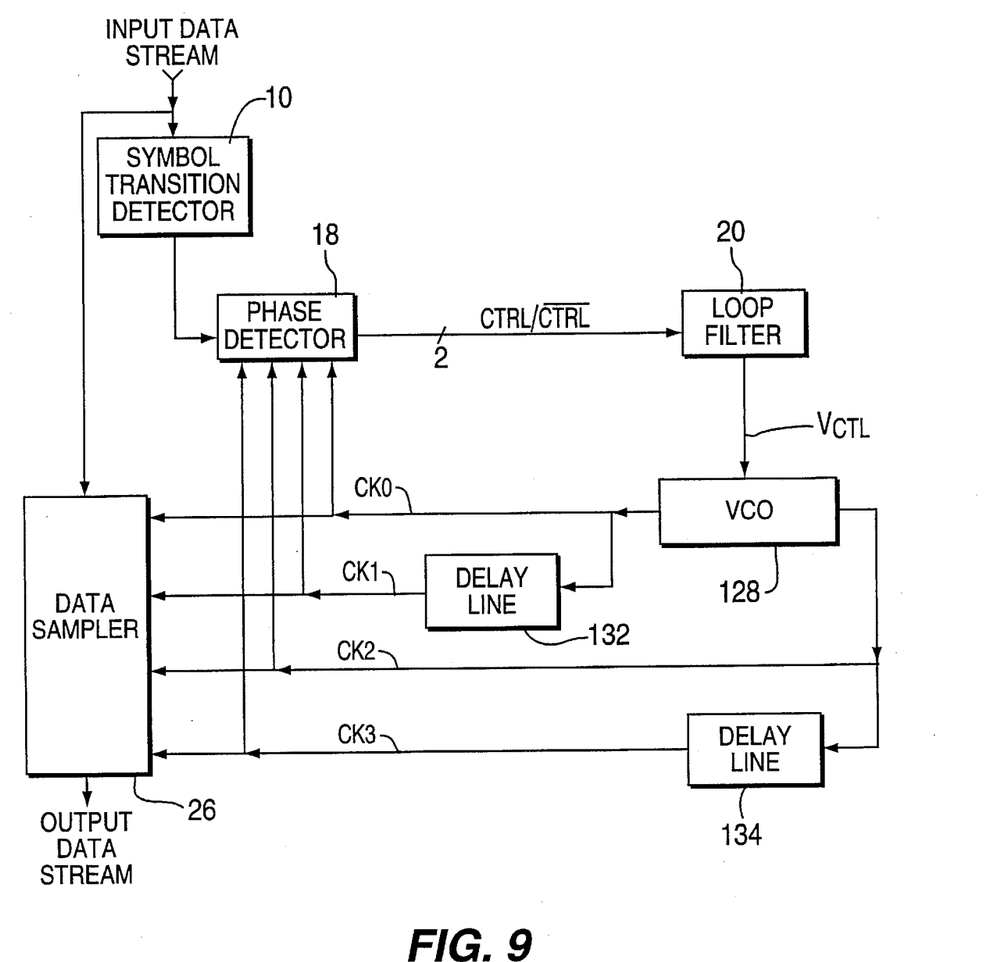

FIG. 9 shows a modification of the FIG. 8 clock generating circuitry that is possible where the VCO 32 is of a form that makes the clock CK0 available in push/pull as clocks CK0 and $\overline{CK0}$. The inverted CK0 clock, $\overline{CK0}$, corresponds to one of the other component clocks—CK3, in the case where the output clock is four-phase. VCO 32 supplies the clock CK0 to the phase detector 18 and to a delay line 36 that supplies the phase detector 18 with the clock(s) of phase(s) intermediate between the phase of CK0 and the phase of $\overline{CK0}$. VCO 32 supplies the clock $\overline{CK0}$ to the phase detector 18 and to a delay line 38 that supplies the phase detector 18 with the clock(s) of phase(s) intermediate between the phase of $\overline{CK0}$ and the phase of CK0.

Figure 10:
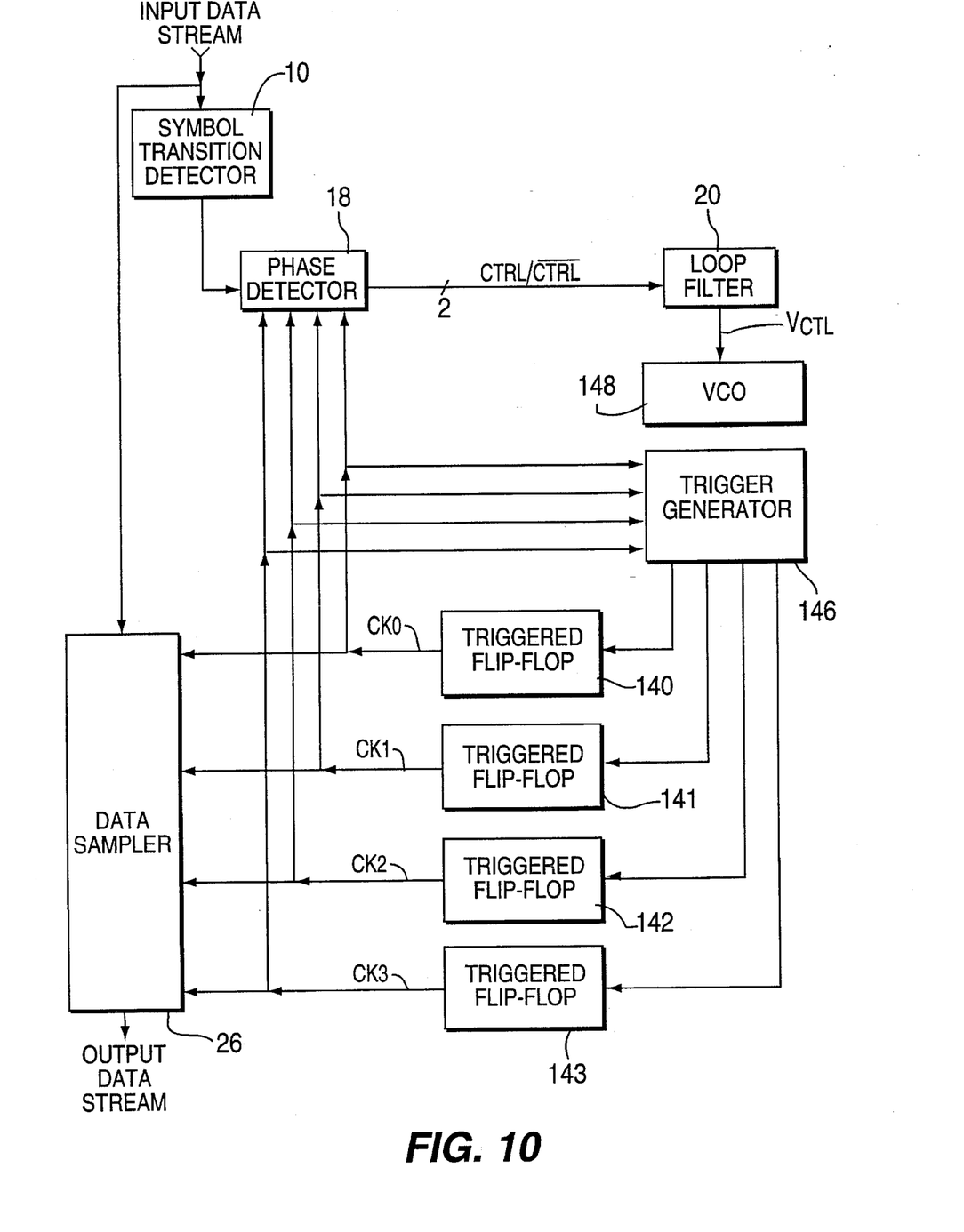
FIGS. 10 and 11 are each a block diagram showing a respective data sampler as may be used in combination with a clock generating circuit embodying the invention.

FIG. 10 shows a modification of the FIG. 8 clock generating circuitry where the VCO 32 and the tapped delay line 34 are dispensed with. The phase-shifted CK0, CK1, CK2 and CK3 clocks are generated by triggered flip-flops 40, 41, 42 and 43, respectively. Triggering circuitry 46 triggers the triggered flip-flops 40, 41, 42 and 43 in proper sequential order responsive to average-axis crossings of oscillations generated by a voltage-controlled oscillator (VCO) 48 oscillating at a multiple of input clock frequency. The VCO 48 is automatically frequency and phase controlled (AFPC'd) by the control voltage $V_{CTL}$ supplied by the loop filter 20.

Figure 11:
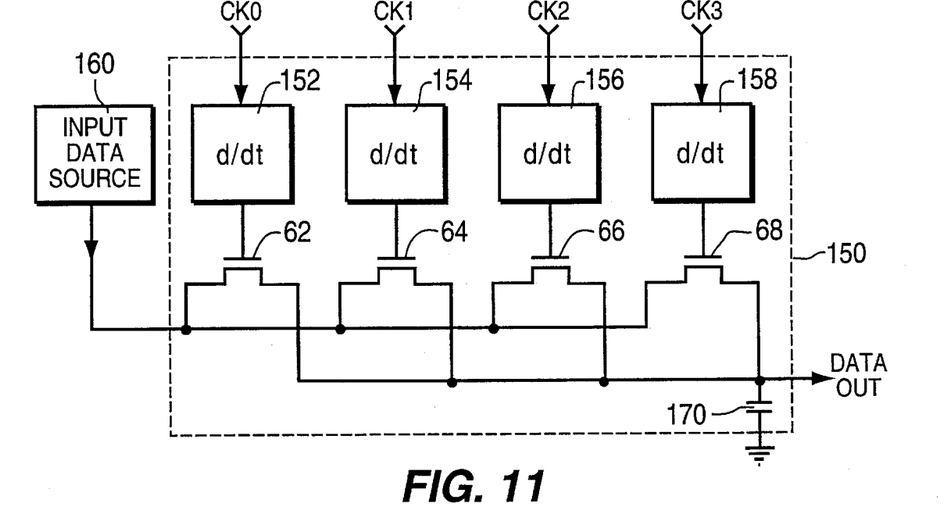

FIG. 11 shows a typical data sampler 50 that can be used with any of the clock regenerating circuits disclosed earlier in this specification. The phase-shifted CK0, CK1, CK2 and CK3 clocks are differentiated respective to time in differentiators 52, 54, 56 and 58, respectively. A data source 60 supplies data samples as input to sampling switches 62, 64, 66 and 68. The sampling switches 62, 64, 66 and 68 are cyclically rendered conductive responsive to positive pulses supplied by differentiators 52, 54, 56 and 58, respectively. The conduction of one of the sampling switches 62, 64, 66 and 68 at the midpoint of each data symbol period charges a hold capacitor 70 to the value of the data at that time, which value is stored on the hold capacitor 60 until the midpoint of the next data symbol period. That is, the sampling switches 62, 64, 66 and 68 and the hold capacitor 70 operate as a sample-and-hold circuit. In an alternative sample-and-hold circuit, the positive pulse responses of the differentiators 52, 54, 56 and 58 can be analog ORed and used to control a single sampling switch selectively applying the data source 60 signal to the hold capacitor 70.

Figure 12:
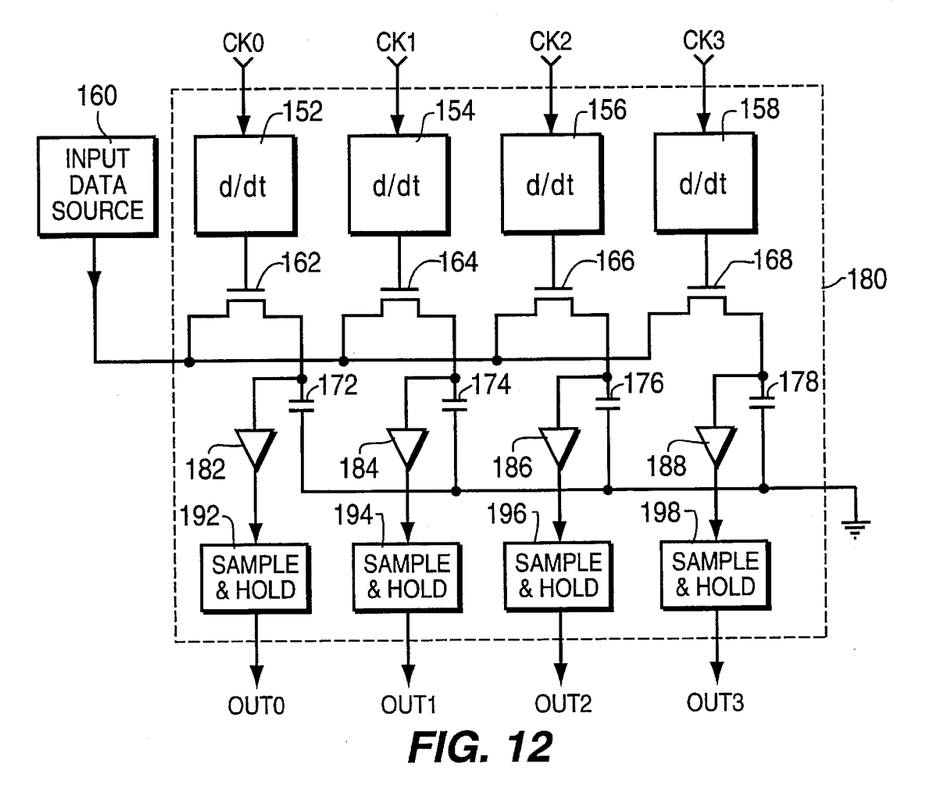
FIG. 12 is a block diagram showing a modification of the data sampler shown in FIG. 11.

FIG. 12 shows a modification 80 of the FIG. 11 data sampler 50 that can be used with any of the clock regenerating circuits disclosed earlier in this specification, which advantageously uses the multiple-phase output clock to sample input data so as to facilitate parallel-serial data processing. For example, a stream of serial-in-time bits can be resampled to a stream of serial-in-time words, each comprising four parallel-in-time bits. Rather than sampling to a single hold capacitor 70, the sampling switches 62, 64, 66 and 68 sample to respective hold capacitors 72, 74, 76 and 78. The held signals on the hold capacitors 72, 74, 76 and 78 are applied as input signals to buffer amplifiers 82, 84, 86 and 88, respectively. Output signals from the buffer amplifiers 82, 84, 86 and 88 are resampled by sampling circuits 92, 94, 96 and 98, respectively, to align their clock phasing. Each of the sampling circuits 92, 94, 96 and 98 can be a respective sample-and-hold circuit comprising a respective sampling switch sampling to a respective hold capacitor in response to positive pulses obtained by slightly delaying the response of differentiator 58.

While the invention is shown and described with reference to particular preferred embodiments, it will be understood by those skilled in the art and acquainted with the foregoing specifications that obvious modifications of these embodiments may be made without departing from the spirit of the invention, and the following claims should be construed to include such modifications within the scope of the invention. Controlling the phases of successive clock transitions collectively rather than individually, in a phase lock loop for controlling data sampling, in order to promote loop stability despite sampling rates being very high, is a modification of known phase lock loops that is generally useful. By way of further examples of such obvious modifications of the invention as particularly described, the circuitry may be modified to implement negative rather than positive logic convention, or conductivity types of transistors can be changed, or the application of clock signals to the gate electrodes of the FETs in any selectively completed discharge path in the discharge controller 24 of FIG. 3 can be reversed from that shown.

What is claimed is:

1. A method for phase-locking an output clock to an input signal with input signal transitions between "0" and "1" logic levels, which said input signal transitions each occur between selected ones of symbol periods that occur consecutively at an input frequency, said method comprising the steps of:

generating an output clock exhibiting transitions between "0" and "1" conditions at an output frequency that is substantially the same as said input frequency;

assigning consecutive transitions of said output clock cyclically to first through $m^{th}$ sets of transitions of said output clock, m being an integer more than one;

controlling the delay of each of said first through $m^{th}$ sets of transitions of said output clock in response to a control signal, for generating first through $m^{th}$ sets of delayed transitions of said output clock;

detecting when the respective delayed transitions of each of said first through $m^{th}$ sets of delayed transitions of said output clock occur at times other than at midpoints of said symbol periods, thus to generate a respective one of m error signal components;

combining all m of said error signal components to generate an error signal; and lowpass filtering said error signal for generating said control signal.

2. A method as set forth in claim 1 for phase-locking an output clock to an input signal with input signal transitions between "0" and "1" logic levels, wherein said input signal is an input clock with transitions between "0" and "1" logic levels at said input frequency.

3. A method for phase-locking an output clock to an input clock with transitions between "0" and "1" logic levels at ones of intervals occurring at an input frequency, said method comprising the steps of:

generating an output clock exhibiting transitions between "0" and "1" conditions at an output frequency that is substantially the same as said input frequency;

assigning consecutive transitions of said output clock cyclically to first through $m^{th}$ sets of transitions of said output clock, m being an integer more than one;

controlling the delay of each of said first through $m^{th}$ sets of transitions of said output clock in response to a control signal, for generating first through $m^{th}$ sets of delayed transitions of said output clock;

performing a phase comparison of said delayed transitions of said output clock in each of said first through $m^{th}$ sets thereof with corresponding transitions in said input clock, thus to generate a respective one of m error signal components;

combining all m of said error signal components to generate an error signal; and lowpass filtering said error signal for generating said control signal.

4. The method for phase-locking an output clock to an input clock set forth in claim 3 included as steps in a method for phase-locking said output clock to a data stream, which method for phase-locking said output clock to a data stream additionally comprises the preliminary steps of:

detecting symbol transitions in said data stream; and generating said input clock with its transitions between "0" and "1" logic levels substantially coinciding in time with said symbol transitions.

5. A method for phase-locking an output clock to an input clock with transitions between "0" and "1" logic levels at ones of intervals occurring at an input frequency, said method comprising the steps of:

generating a multiple-phase output clock exhibiting transitions between "0" and "1" at an output frequency that is the same as said input frequency, said multiple-phase output clock comprising a plurality of component clocks each of a frequency that is a submultiple of said input frequency;

controlling the delay of said multiple-phase output clock in response to a control signal, thereby to delay each of said plurality of component clocks in like amount for generating a respective delayed response to each of said component clocks;

comparing the phase of said input clock with the phase of each of said respective delayed responses to said component clocks, thus to generate a respective component of an error signal;

combining all of said components of said error signal to generate said error signal; and lowpass filtering said error signal for generating said control signal.

6. The method for phase-locking an output clock to an input clock set forth in claim 5 included as steps in a method for phase-locking said output clock to a data stream, which method for phase-locking said output clock to a data stream additionally comprises the preliminary steps of:

detecting symbol transitions in said data stream; and generating said input clock with its transitions between "0" and "1" logic levels substantially coinciding in time with said symbol transitions.

7. A method for phase-locking an output clock to an input clock with transitions between "0" and "1" logic levels at ones of intervals occurring at an input frequency, said method comprising the steps of:

generating a multiple-phase output clock exhibiting transitions between "0" and "1" at an output frequency that is the same as said input frequency, said multiple-phase output clock comprising a plurality of component clocks each of a frequency that is a submultiple of said input frequency;

controlling the delay of said multiple-phase output clock in response to a control signal, thereby to delay each of said plurality of component clocks in like amount for generating a respective delayed response to each of said component clocks;

comparing the phase of said input clock with the phases of said respective delayed responses to each of said component clocks;

constructively combining the results of comparing the phase of said input clock with the phases of said respective delayed responses to each of said component clocks, thus to generate an error signal; and lowpass filtering said error signal for generating said control signal.

8. The method for phase-locking an output clock to an input clock set forth in claim 7 included as steps in a method for phase-locking said output clock to a data stream, which method for phase-locking said output clock to a data stream additionally comprises the preliminary steps of:

detecting symbol transitions in said data stream; and generating said input clock with its transitions between "0" and "1" logic levels substantially coinciding in time with said symbol transitions.

9. A method for generating a clock in a digital communication system which said clock is phase-synchronized with symbols in a data input signal, which said symbols occur at a symbol rate, said method for generating a clock comprising steps of:

generating 2n clocks each having a predetermined same frequency which is a submultiple of said symbol rate and having phase delay of π/n between successive ones of said 2n clocks, n being a positive integer;

comparing the phasing of each of said 2n clocks respective to said symbols to detect any misphasing therefrom as an error signal component;

loop-filtering for supplying a phase control signal in response to said error signal components; and phase controlling for simultaneously shifting the phases of the clocks ahead or behind in response to said phase control signal until the edges of said 2n clocks occur at the midpoints of said symbol periods.

10. A method for generating a clock in a digital communication system which said clock is phase-synchronized with symbols in a data input signal, said method for generating a clock comprising steps of:

generating 2n clocks each having a frequency corresponding to ½/n times a maximum baud rate for said data stream input, with a phase delay of π/n between successive ones of said 2n clocks;

comparing the phasing of said 2n clocks respective to said symbols to detect any misphasing therefrom as an error signal;

loop-filtering for supplying a phase control signal in response to said error signal; and phase controlling for simultaneously shifting the phases of the clocks ahead or behind in response to said phase control signal until the edges of said 2n clocks occur at the midpoints of said symbol periods.

11. A clock generating circuit for generating an output clock phase-locked with an input signal with input signal transitions between "0" and "1" logic levels, which said input signal transitions each occur between selected ones of symbol periods that occur consecutively at an input frequency, said clock generating circuit comprising:

a clock generator for generating m component clocks of an m-phase output clock, m being an integer greater than one, each of said m component clocks having a frequency (1/m) times said input frequency and having a different respective phase with respect to each other of said component clocks, each of which different respective phases is expressible as a positive multiple less than m of 2π/m radians;

a detector for detecting any misphasing of said m component clocks from midpoints of said symbol periods to generate an error signal;

a loop filter for supplying a phase control signal in response to said error signal supplied from said phase detector; and a phase controller responsive to said phase control signal for simultaneously shifting the phases of said m component clocks ahead or behind so as to reduce any misphasing of the edges of said m component clocks respective to said input signal transitions.

12. A clock generating circuit as set forth in claim 11, wherein said input signal is an input clock with transitions between "0" and "1" logic levels at said input frequency, and wherein said detector for detecting any misphasing of said m component clocks from midpoints of said symbol periods comprises:

a phase detector for comparing the phasing of said m component clocks respective to said transitions between "0" and "1" logic levels of said input clock to generate said error signal.

13. A clock generating circuit as set forth in claim 12 included in a digital communication system for generating a clock phase-locked in quadrature phasing with symbol transitions in an input data stream, said digital communication system also including:

a symbol transition detector for detecting symbol transitions occurring between symbol periods in said data stream and generating an input clock with said transitions between "0" and "1" logic levels at said input frequency, which said input clock transitions coincide in time with said symbol transitions.

14. A clock generating circuit as set forth in claim 13, wherein said m clocks each are of a frequency that is ½m times a maximum baud rate of said input data.

15. A clock generating circuit as claimed in claim 12, wherein said loop filter comprises:

a capacitor for supplying between first and second plates thereof said phase control signal; and a differential transconductance amplifier responding to said error signal supplied from said phase detector for changing the charge stored within said capacitor, charging said capacitor when said error signal is of a first sense of polarity and discharging said capacitor when said error signal is of a second sense of polarity opposite to said first sense of polarity.

16. A clock generating circuit for generating an output clock phase-locked with an input clock with transitions between "0" and "1" logic levels at ones of intervals occurring at an input frequency, which said input signal transitions each occur between selected ones of symbol periods that occur consecutively at an input frequency, said clock generating circuit comprising:

a clock generator for generating m component clocks of an m-phase output clock, m being an even integer that is twice another integer n greater than one, each of said m component clocks exhibiting respective transitions between "0" and "1" logic levels thereof, having a frequency (1/m) times said input frequency, and having a different respective phase with respect to each other of said component clocks, each of which different respective phases is expressible as a positive multiple less than m of 2π/m radians;

a phase detector comparing the phasing of said m component clocks respective to said transitions between "0" and "1" logic levels of said input clock, for detecting any misphasing of said m component clocks from midpoints of said symbol periods to generate an error signal;

a loop filter for supplying a phase control signal in response to said error signal supplied from said phase detector; and a phase controller responsive to said phase control signal for simultaneously shifting the phases of said m component clocks ahead or behind so as to reduce any misphasing of the edges of said m component clocks respective to said input clock; wherein said phase detector comprises:

first and second nodes for supplying said error signal in push/pull;

third, fourth and fifth nodes;

biasing circuitry tending to pull respective potentials at said first node and at said second node in a first direction and tending to pull potential at said fifth node in a second direction opposite to said first direction;

means responsive to said input clock being at "0" logic level for selectively clamping said first node to said third node;

means responsive to said input clock being at "0" logic level for selectively clamping said second node to said fourth node;

means responsive to said input clock being at "1" logic level for selectively clamping said first node to said fourth node;

means responsive to said input clock being at "1" logic level for selectively clamping said second node to said third node; and means for alternately clamping said third node and said fourth node to said fifth node, the alternation of said alternate clamping occurring in response to each change in said logic levels of said m component clocks of said m-phase output clock.

17. A clock generating circuit as set forth in claim 16, wherein said means for alternately clamping said third node and said fourth node to said fifth node comprises first through $n^{th}$ means for selectively providing a respective conductive path between said third node and said fifth node responsive to a respective pair of said m component clocks of said m-phase output clock; and $(n+1)^{th}$ through $2n^{th}$ means for selectively providing a respective conductive path between said fourth node and said fifth node responsive to a respective pair of said m component clocks of said m-phase output clock.

18. A clock generating circuit as set forth in claim 16, wherein said biasing circuitry comprises:

a sixth node;

a first resistor connecting said first and sixth nodes;

a second resistor connecting said second and sixth nodes; and means for causing substantially constant current to circulate through said fifth and sixth nodes.

19. A clock generating circuit as claimed in claim 16, wherein said loop filter comprises:

a capacitor for supplying between first and second plates thereof said phase control signal; and a differential transconductance amplifier responding to said error signal supplied in push/pull from said first and second nodes for changing the charge stored within said capacitor, charging said capacitor when said error signal is of a first sense of polarity and discharging said capacitor when said error signal is of a second sense of polarity opposite to said first sense of polarity.

20. A clock generating circuit as set forth in claim 16 included in a digital communication system for generating a clock phase-locked in quadrature phasing with symbol transitions in an input data stream, said digital communication system also including:

a symbol transition detector for detecting symbol transitions occurring between symbol periods in said data stream and generating Uan input clock with said transitions between "0" and "1" logic levels at said input frequency, which said input clock transitions coincide in time with said symbol transitions.

21. A clock generating circuit as set forth in claim 20, wherein said m clocks each are of a frequency that is ½m times a maximum baud rate of said input data.

22. A clock generating circuit for generating an output clock phase-locked with an input signal with input signal transitions between "0" and "1" logic levels, which said input signal transitions each occur between selected ones of symbol periods that occur consecutively at an input frequency, said clock generating circuit comprising:

a controlled oscillator for generating m component clocks of an m-phase output clock, m being an integer greater than one, each of said m component clocks having a frequency (1/m) times said input frequency and having a different respective phase with respect to each other of said component clocks, each of which different respective phases is expressible as a positive multiple less than m of 2π/m radians, the phase of each of said m component clocks being adjustable responsive to a control signal received by said controlled oscillator;

a detector for detecting any misphasing of said m component clocks from midpoints of said symbol periods to generate an error signal;

a loop filter for supplying said control signal in response to said error signal supplied from said phase detector.

23. A clock generating circuit as set forth in claim 22, wherein said input signal is an input clock with transitions between "0" and "1" logic levels at said input frequency, and wherein said detector for detecting any misphasing of said m component clocks from midpoints of said symbol periods comprises a phase detector for comparing the phasing of said m component clocks respective to said input clock to generate said error signal.

24. A clock generating circuit as set forth in claim 23 included in a digital communication system for generating a clock phase-locked in quadrature phasing with symbol transitions in an input data stream, said digital communication system also including:

a symbol transition detector for detecting symbol transitions occurring between symbol periods in said data stream and generating said input clock with said transitions between "0" and "1" logic levels at said input frequency, which said input clock transitions coincide in time with said symbol transitions.

25. A clock generating circuit as set forth in claim 24, wherein said m clocks each are of a frequency that is ½m times a maximum baud rate of said input data.

26. A clock generating circuit for generating an output clock phase-locked with an input clock with transitions between "0" and "1" logic levels at ones of intervals occurring at an input frequency, which said input signal transitions each occur between selected ones of symbol periods that occur consecutively at an input frequency, said clock generating circuit comprising:

a controlled oscillator for generating m component clocks of an m-phase output clock, m being an integer greater than one, each of said m component clocks exhibiting respective transitions between "0" and "1" logic levels thereof, having a frequency (1/m) times said input frequency, and having a different respective phase with respect to each other of said component clocks, each of which different respective phases is expressible as a positive multiple less than m of 2π/m radians, the phase of each of said m component clocks being adjustable responsive to a control signal received by said controlled oscillator;

a phase detector comparing the phasing of said m component clocks respective to said transitions between "0" and "1" logic levels of said input clock, for detecting any misphasing of said m component clocks from midpoints of said symbol periods to generate an error signal; and a loop filter for supplying a phase control signal in response to said error signal supplied from said phase detector; wherein said phase detector comprises:

first and second nodes for supplying said error signal in push/pull;

third, fourth and fifth nodes;

biasing circuitry tending to pull respective potentials at said first node and at said second node in a first direction and tending to pull potential at said fifth node in a second direction opposite to said first direction;

means responsive to said input clock being at "0" logic level for selectively clamping said first node to said third node;

means responsive to said input clock being at "0" logic level for selectively clamping said second node to said fourth node;

means responsive to said input clock being at "1" logic level for selectively clamping said first node to said fourth node;

means responsive to said input clock being at "1" logic level for selectively clamping said second node to said third node; and means for alternately clamping said third node and said fourth node to said fifth node, the alternation of said alternate clamping occurring in response to each change in said logic levels of said m component clocks of said m-phase output clock.

27. A clock generating circuit as set forth in claim 26, wherein said means for alternately clamping said third node and said fourth node to said fifth node comprises first through $n^{th}$ means for selectively providing a respective conductive path between said third node and said fifth node responsive to a respective pair of said m component clocks of said m-phase output clock; and $(n+1)^{th}$ through $2n^{th}$ means for selectively providing a respective conductive path between said fourth node and said fifth node responsive to a respective pair of said m component clocks of said m-phase output clock.

28. A clock generating circuit as set forth in claim 26, wherein said biasing circuitry comprises:

a sixth node;

a first resistor connecting said first and sixth nodes;

a second resistor connecting said second and sixth nodes; and means for causing substantially constant current to circulate through said fifth and sixth nodes.

29. A clock generating circuit as claimed in claim 26, wherein said loop filter comprises:

a capacitor for supplying between first and second plates thereof said control signal; and a differential transconductance amplifier responding to said error signal supplied in push/pull from said first and second nodes for changing the charge stored within said capacitor, charging said capacitor when said error signal is of a first sense of polarity and discharging said capacitor when said error signal is of a second sense of polarity opposite to said first sense of polarity.

30. A clock generating circuit as set forth in claim 26 included in a digital communication system for generating a clock phase-locked in quadrature phasing with symbol transitions in an input data stream, said digital communication system also including:

a symbol transition detector for detecting symbol transitions occurring between symbol periods in said data stream and generating said input clock with said transitions between "0" and "1" logic levels at said input frequency, which said input clock transitions coincide in time with said symbol transitions.

31. A clock generating circuit as set forth in claim 30, wherein said m clocks each are of a frequency that is ½m times a maximum baud rate of said input data.

* * * * *